United States Patent [19]

Kalvaitis et al.

[11] Patent Number: 4,862,324
[45] Date of Patent: Aug. 29, 1989

[54] SWITCHGEAR ENCLOSURE AND METHOD OF FABRICATION

[75] Inventors: Arvydas J. Kalvaitis, Northbrook; Thomas W. Ernst, Mt. Prospect, both of Ill.

[73] Assignee: S&C Electric Company, Chicago, Ill.

[21] Appl. No.: 922,376

[22] Filed: Oct. 23, 1986

[51] Int. Cl.⁴ ............................................. H05K 5/00
[52] U.S. Cl. .................................. 361/390; 312/257.1
[58] Field of Search ............... 361/390, 391, 427–428; 312/257 R, 257 SK, 257 SM, 257 A

[56] References Cited

U.S. PATENT DOCUMENTS

| | | | |
|---|---|---|---|
| 2,424,345 | 7/1947 | West | 361/429 |
| 2,959,715 | 11/1960 | Leonchictk | 361/429 |
| 3,670,466 | 6/1972 | Lynch | 52/204 |
| 3,845,590 | 11/1974 | Ertl | 52/36 |
| 3,923,134 | 12/1975 | Rezazadeh | 194/9 |
| 3,946,528 | 3/1976 | Jacobson et al. | 52/79 |
| 3,988,869 | 11/1976 | Tuttle | 52/285 |
| 4,281,495 | 8/1981 | Lee | 52/584 |
| 4,295,693 | 10/1981 | Viklund | 312/257 MS |
| 4,334,260 | 6/1982 | Schmelter et al. | 361/360 |
| 4,430,838 | 2/1984 | Bains | 52/584 |
| 4,435,935 | 3/1984 | Larrea | 52/461 |
| 4,502,097 | 2/1985 | Takahashi | 361/428 |

FOREIGN PATENT DOCUMENTS 479591 12/1951 Canada ................ 361/428

Primary Examiner—A. D. Pellinen
Assistant Examiner—Greg Thompson

[57] ABSTRACT

An enclosure and method of fabrication thereof is provided for metal-enclosed switchgear. The enclosure includes at least one access opening and is assembled from a plurality of generally planar panels. The enclosure includes at least three vertical wall panels and a roof panel. The three vertical wall panels each include turned edges so as to define first flanges along at least a substantial portion of each edge thereof. Each of the three vertical wall panels can be formed and painted prior to assembly of the enclosure. The three vertical wall panels when assembled define three sides of the enclosure. At least one panel at each of the abutting edges of the three vertical wall panels includes a second turned edge that forms a second flange which extends substantially perpendicularly to the first flange. The enclosure is assembled by a plurality of fasteners that clamp or affix the first flange of a vertical wall panel to the second flange of the abutting vertical wall panel. Accordingly, the flanges of the vertical wall panels define integrally formed structural members that function as a frame. The second flanges are formed along each vertical edge of one of the vertical wall panels which function as a backwall. For the convenient support of electrical components to be contained by the enclosure, support members are affixed to the second flanges so as to span the width of the backwall.

14 Claims, 4 Drawing Sheets

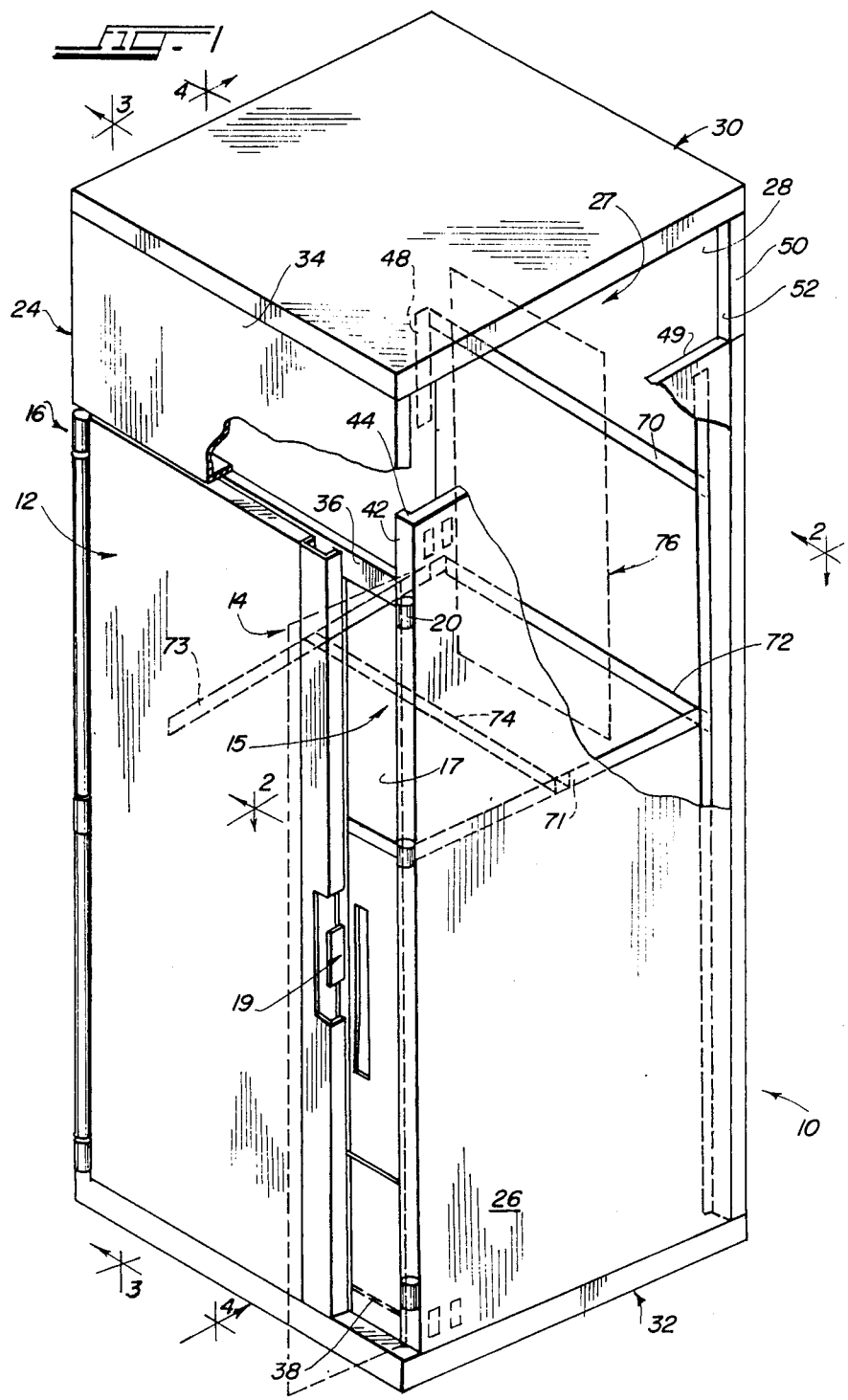

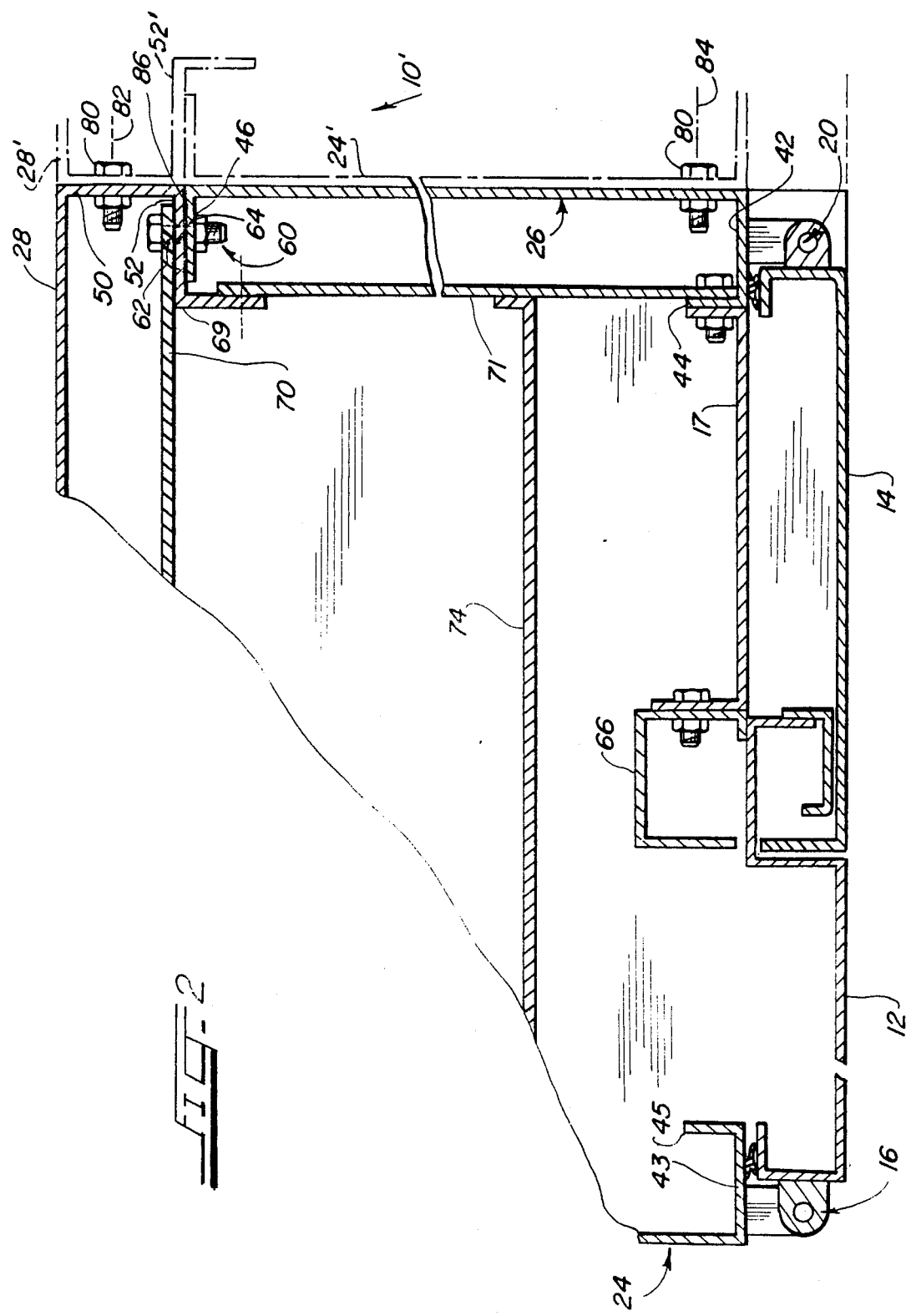

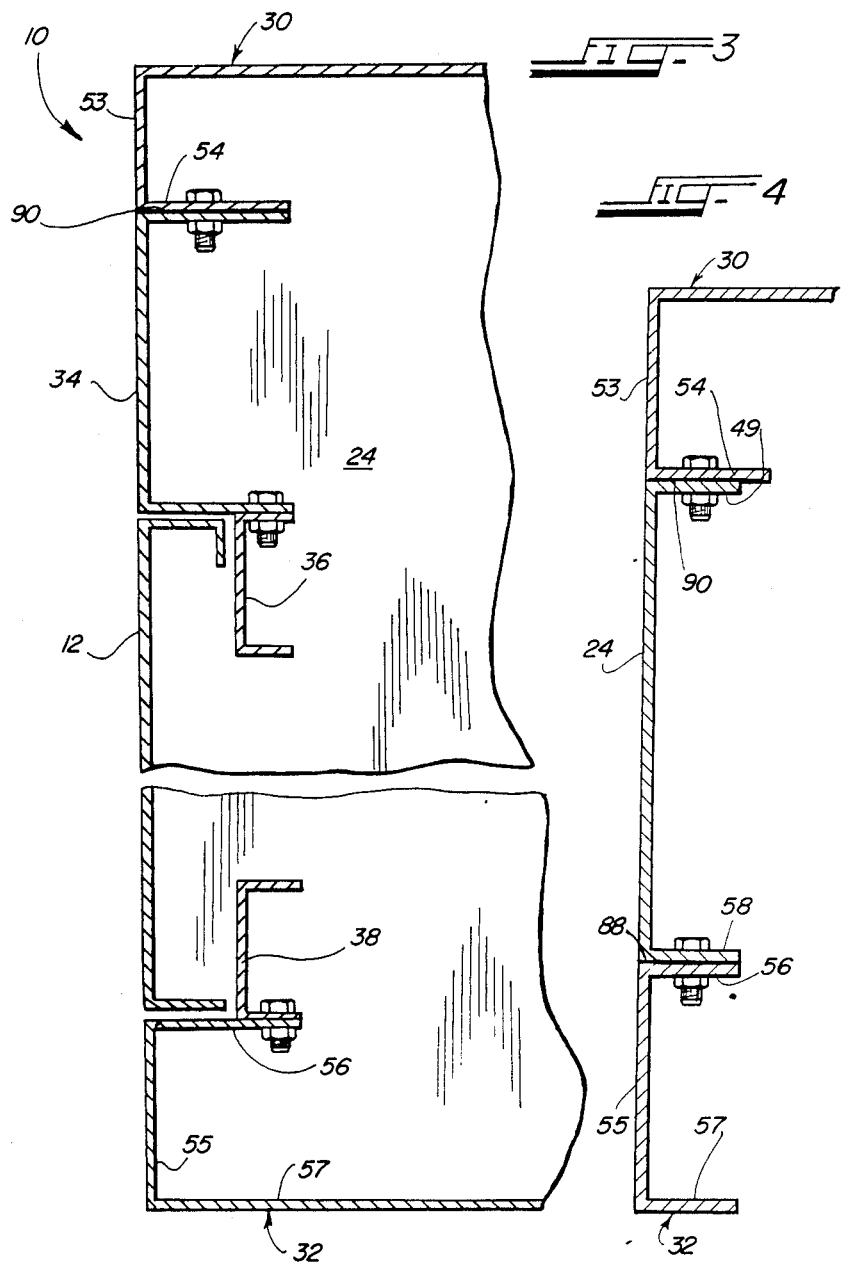

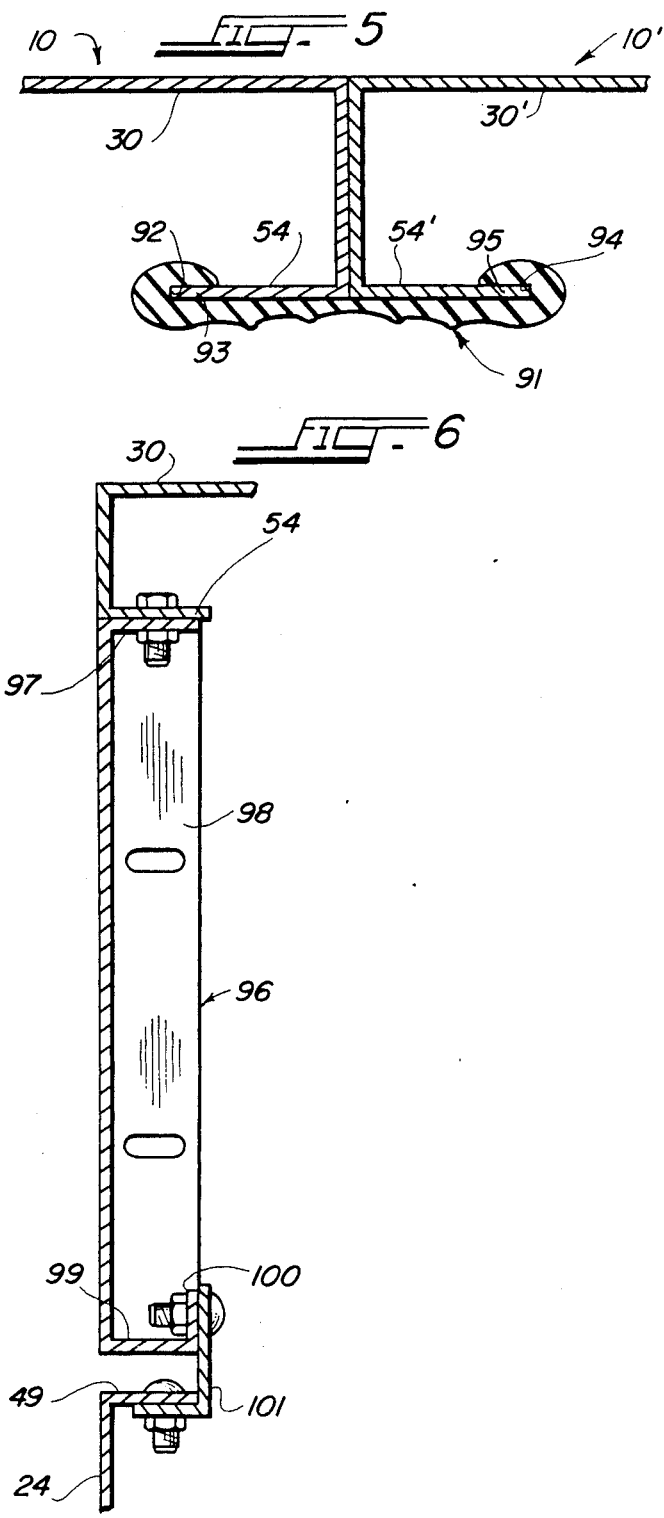

SWITCHGEAR ENCLOSURE AND METHOD OF FABRICATION

BACKGROUND OF THE INVENTION

1. Field of the Invention

The present invention relates generally to the field of enclosures and more specifically to switchgear enclosures which have one or more access doors and that are efficiently fabricated and assembled without the use of any externally-exposed fasteners.

2. Description of the Related Art

Metal-enclosed switchgear is well-known in the art; for example, as disclosed in U.S. Pat. No. 4,073,000. Typically, such switchgear is utilized in electrical distribution systems for large buildings, factories, industrial parks, etc. Such switchgear typically may include transformers, fuses, interrupter switches, electrical switches and other such electrical components necessary for electrical distribution systems.

The switchgear typically comprises a metal enclosure having one or more doors which provide access into the interior portions of the enclosure where the electrical components are situated. Since the electrical components are typically energized at high voltage, such metal-enclosed switchgear ordinarily has various security features including locks which are provided to hinder unauthorized access and vandalism.

Metal-enclosed switchgear of this general type is manufactured by S&C Electric Company, Chicago, Illinois as described in Descriptive Bulletin 621-30. The metal-enclosed switchgear enclosure as described therein is fabricated by the appropriate shearing, punching and folding of sheets of steel for the various walls and door portions. Next, various support members such as brackets, channels, angles and tabs are welded to the side and back sheets for appropriate supporting and mounting of the components to be housed by the particular enclosure. For example, if one enclosure contains a fuse and a switch, the support members are located in a first particular configuration. For another enclosure that contains a power-operated switch, support members are located in a second, different configuration where additional tabs are needed on the side sheets. After the various support members are welded into place, the two sidewall sheets, the rear wall, and the various front members that define the access openings are welded to each other to define the enclosure. Since the sheets are typically at least seven to eight feet in length, three to four feet wide, and of 11-gauge steel, the handling of the sheets while they are being joined by welding is a relatively complicated and time-consuming process. After the welding operation, grinding of the welded areas as well as cleaning and preparation of the steel surfaces are necessary before the painting of the enclosure. The entire enclosure is then painted. The individual enclosures are then assembled into multiple-bay line-ups. Thereafter, the fabrication of the enclosure being complete, assemblers install components and wiring personnel complete the necessary wiring to automatic controls, switch operators and the like, as required. Additionally, one or more hinged doors are added. While these metal-enclosed switchgear enclosures, as described, constitute high-quality and secure enclosures, manufacturing of the enclosures is relatively time-consuming and thus costly. Other types of enclosures are fabricated by the fastening of panels onto a frame.

Accordingly, while the enclosures of the prior art may be generally suitable for their intended purpose, it would be desirable to provide an enclosure that is efficiently fabricated from flat panels without frames or extensive welding and that includes no external fasteners.

SUMMARY OF THE INVENTION

Accordingly, it is a principal object of the present invention to provide an enclosure for metal-enclosed switchgear which is fabricated from flat panels without welding, frames, or exposed fasteners so as to provide a desirable and secure enclosure while requiring minimal fabrication and assembly time during manufacturing.

It is another object of the present invention to fabricate an enclosure from generally flat panels that include integrally-formed structural members to provide rigidity and function as a frame for assembling the enclosure.

It is yet another object of the present invention to provide a modular enclosure for assembly to other enclosures of the same type; the modular enclosure including features to accomodate various components requiring various mounting locations within the enclosure and the modular enclosure being economically and efficiently manufactured and assembled.

It is a further object of the present invention to provide enclosures for metal-enclosed switchgear that are fabricated from generally flat panels and standardized parts with the mounting of various configurations of components being achieved by support members which are affixed to integrally-formed structural members of the flat panels.

These and other objects of the present invention are efficiently achieved by an enclosure for metal-enclosed switchgear having at least one access opening and being assembled from a plurality of generally planar panels. The enclosure includes at least three vertical wall panels and a roof panel. The three vertical wall panels each include turned edges so as to define first flanges along at least a substantial portion of each edge thereof. Each of the three vertical wall panels can be formed and painted prior to assembly of the enclosure. The three vertical wall panels when assembled define three sides of the enclosure. At least one panel at each of the abutting edges of the three vertical wall panels includes a second turned edge that forms a second flange which extends substantially perpendicularly to the first flange. The enclosure is assembled by a plurality of fasteners or other fastening means that clamp or affix the first flange of a vertical wall panel to the second flange of the abutting vertical wall panel. Accordingly, the flanges of the vertical wall panels define integrally formed structural members that function as a frame. In one specific configuration, the second flanges are formed along each vertical edge of one of the vertical wall panels which function as a backwall. For the convenient support of electrical components to be contained by the enclosure, support members are affixed to the second flanges so as to span the width of the backwall. Components and their support frames can then be assembled onto the support members. Additionally, side support members are affixed between a third flange on the backwall panel and a second flange on the front vertical edge of the two vertical wall panels that function as sidewalls to provide support for mounting components within the enclosure. To provide support for components in the central portion of the enclosure, one or more additional support members are added that span the side support members. One or more access doors are attached to the front of the enclosure, for example, via hinges carried by the first flange on the vertical edges of the wall panels. Suitable latching mechanisms are also installed along with provision for locks or the like. In one specific configuration for outdoor use, a left-hand door spans an access opening that extends over a substantial portion of the width of the enclosure for access to the components. A right-hand door or cover is provided that overlaps a portion of the left-hand door and that includes a latching mechanism that automatically latches when the right door is closed.

BRIEF DESCRIPTION OF THE DRAWING

FIG. 1 is a perspective view of an enclosure of the present invention;

FIG. 2 is a partial sectional view taken along the line 2—2 of FIG. 1;

FIG. 3 is a partial sectional view taken from the line 3—3 of FIG. 1;

FIG. 4 is a partial sectional view taken from the line 4—4 of FIG. 1;

FIG. 5 is a partial sectional view illustrating two assembled enclosures and a sealing arrangement of the present invention; and FIG. 6 is a partial sectional view illustrating a bus extension cover for the enclosure of the present invention.

DETAILED DESCRIPTION

Referring now to FIG. 1, the enclosure 10 of the present invention, which is preferably for use with metal-enclosed switchgear, is a self-contained metal enclosure to which access is provided by a left door 12 which is pivotally mounted with respect to the enclosure 10 by a plurality of hinges 16. The interior of the switchgear enclosure 10 houses electrical components such as switches, potential transformers, fuses or other electrical components.

In some installations and applications, for example for outdoor use, a right cover 14 is provided that partially overlaps the closed left door 12 and which also overlies a low-voltage compartment 15 which houses switch operators and automatic control equipment; controls for these arrangements being found on the compartment panel 17 which is accessible when the right cover 14 is in the open position. The right cover 14 is pivotally mounted with respect to the enclosure 10 by means of a plurality of hinges 20. As can be seen in more detail in FIG. 2, the low-voltage right cover 14 overlaps a portion of the medium-voltage compartment left door 12 so that the medium-voltage compartment door via a latch mechanism indicated generally at 19 cannot be actuated to open the left door 12 until the right cover 14 is opened. In a preferred embodiment, to provide additional security measures in addition to padlocks or the like, the right cover 14 includes access control provisions as provided by a latching mechanism (not shown) which automatically latches upon door closure and which utilizes a specially adapted tool for the opening thereof, all as described in more detail in U.S. Pat. No. 4,489,966.

The enclosure 10 is defined by left and right sidewall panels 24 and 26, respectively, a backwall panel 28, a roof 30 and a base 32. An upper channel 36 and a lower channel 38 span the front access opening and are fastened to the sidewalls 24,26. When the door is the height as shown in FIG. 1, a front panel 34 is provided, as shown in more detail in FIGS. 2 and 3. If the height of the door 12 is the full height of the enclosure 10 between the base 32 and the roof 30, then no front panel 34 is utilized and the upper channel 36 is mounted adjacent the roof 30. As can best be seen in FIGS. 2 and 3, the right sidewall 26 along the front vertical edge thereof includes a doubled turned edge defined by two right angle bends so as to form flanges 42,44. The rear vertical edge of the right sidewall panel 26 includes a single turned edge to form a flange 46. The left sidewall 24 includes similar front-edge flanges 43,45 and a flange 48 along the rear vertical edge, shown in phantom in FIG. 1. The backwall 28 at either vertical edge includes double turned edges so as to form flanges 50,52. The roof 30 includes double turned edges to form flanges 53,54. The base 32, in a preferred arrangement, includes an upstanding portion 55, an upper flange 56 and a lower flange 57. Referring now additionally to FIG. 4, the sidewall panels 24,26 along their horizontal edges include upper and lower turned edges to form upper flanges 49 [shown in FIG. 1 for panel 26] and lower flanges 58 [not shown for panel 26]. Similarly, the backwall panel 28 includes upper and lower flanges at the upper and lower horizontal edges thereof similar to the flanges 49,58 of the sidewall panel 24. The flanges 50, 42 and 43 may be characterized as first flanges, while the flanges 52, 44 and 45 may be characterized as second flanges.

Accordingly, for fabrication of the enclosure 10, the sidewalls 24,26 and the backwall 28 are prepared, e.g. from 11-gauge sheet metal, by appropriate shearing, punching and forming with the surfaces, edges and features as shown and as described above. Next, the panels 24, 26 and 28 are painted prior to assembly. During assembly, the panels 24, 26 and 28 with the upper and lower channels 36,38 are assembled via fasteners; e.g. fastener 60 affixing or clamping the backwall panel 28 to the right sidewall 26 via appropriate apertures 62,64 in the flanges 52,46 respectively. Similarly, the left sidewall 24 is attached to the backwall 28 with similar fasteners. Additionally, the roof 30, the base 32 and the upper and lower channels 36,38 are attached via suitable apertures and fasteners; e.g., as shown in FIGS. 3 and 4. The front panel 34, where utilized, is also attached to the roof 30 and the upper channel 36 as shown in FIG. 3. Additionally, the compartment cover 17 and a center channel 66 are also assembled into the enclosure as shown in FIG. 2. The enclosure 10 is then ready for installation of the various components; no further manufacturing process tasks being required since the panels, roof and base have been previously painted before assembly thereof to define the enclosure. After the installation of the components, the doors 12,14 via hinges 16,20 are respectively attached along with the various latch components; the hinges 16,20 being affixed to the flanges 43,42 respectively. While fasteners are described for illustrative purposes, it should be realized that other means for fastening or attaching the various flanges may be utilized in other specific embodiments.

For the installation of typical components, support members or angles, e.g. an upper support member 72 and a lower support member 70, are fastened between the flanges 52 of the backwall panel 28 so as to provide horizontal support members. The components such as a fuse array referred to generally at 76 is then attached to the support members 70,72. In the preferred embodiment, the backwall 28, when fabricated, is additionally provided with a third flange 69 that extends substantially perpendicularly to the flange 52. For certain components such as power-operated switches or the like, additional horizontal support members 71,73 are affixed between the third flanges 69 of the backwall 28 and the respective second flanges 45,44 of the sidewalls 24,26 to which a frame or structural support member of the components are attached for additional support. To mount components within the center of the enclosure 10, a support member 74 is fastened between the support members 71,73. During assembly, gaskets 86 (FIG. 2) are applied between each of the sidewall panels 24,26 and the backwall 28. Additionally, gaskets 88 and 90 (FIGS. 3 and 4) are applied around the perimeter of the base 32 and the roof 30 respectively. The gaskets may also be referred to as seal members and in a preferred arrangement are fabricated from closed cell material. In addition to providing the function of an integrally-formed frame assembly, the flanges on the panels also contribute to the structural integrity of the panels including the rigidity and structural strength thereof and the maintainance of the straightness of the panels. As can be seen in FIGS. 2 and 3, the door 12 and the cover 14 also include turned edges to form flanges.

Referring now to FIG. 2, in order to assemble two or more enclosures of the type as shown in FIG. 1, an enclosure 10', identical to the enclosure 10 except for the mounting of components and future bus extension openings, is assembled to the enclosure 10 by means of fasteners 80 along the axes 82,84 to provide a lineup of multiple enclosures referred to as bays; the left sidewall 24' of the enclosure 10' being attached to the right sidewall 26 of the enclosure 10 and the respective backwalls 28,28' being attached. In a specific embodiment, one of the adjoining sidewalls in multiple-bay configurations is omitted; e.g., sidewall 26 or 24'. Three-phase buses or the like run between various bays in the line-up such as between enclosures 10 and 10' via the bus extension opening 27 of enclosure 10 illustrated in FIG. 1. If the enclosure 10 is intended for a position in a line-up that is intermediate other bays, the bus extension openings 27 are provided at both sidewalls 24,26 by means of reduced height sidewalls 24,26.

Referring additionally to FIG. 5, a roof gasket 91 is provided to seal the enclosures 10 and 10' via the roof panels 30 and 30'. The gasket 91 is extruded from a suitable elastomer with integrally-formed receiving channels 92,94 for receiving the flange portions 93,95 of the roof flanges 54,54'. The gasket 91 is also applied to seal the flanges 52,52' of the backwall panels 28,28' over the portions extending above the sidewalls 26,24' (FIG. 2). The gasket 91 may also be characterized as a seal arrangement.

If the enclosure 10 is included as an end bay in a line-up that may be extended or expanded in the future, the opening 27 is provided and a bus extension cover 96 (referring to FIG. 6) is fastened to the roof 30 and the backwall 28. Accordingly, when future expansion is performed, the bus extension cover 96 is removed. The bus extension cover 96 is a generally planar member including a horizontal upper flange 97 which is affixed to the flange 54 of the roof 30. A rear, vertical flange 98 is provided which is affixed to the backwall 28. In a preferred arrangement, a double-turned edge is provided at the lower horizontal edge of the bus extension cover 96 to form flanges 99 and 100. A channel member 101 is provided that is affixed to the upper flange 49 of the sidewall 24 and to the vertical flange 100 of the bus extension cover 96. Similarly, another channel member (not shown) is provided to affix the bus extension cover 96 via flanges similar to flanges 99,100 to the front panel 34. When it is desired to expand the bus by means of positioning an enclosure to the left of the left sidewall 24 in FIG. 6, after the enclosures have been assembled to each other, the bus extension cover 96 is removed via disassembly of the various fasteners.

While there have been illustrated and described various embodiments of the present invention, it will be apparent that various changes and modifications will occur to those skilled in the art. For example, while the enclosure 10 has been described in one embodiment with the backwall panel 28 including double turned edges to form the flanges 50,52, it should also be realized that in another specific embodiment, the sidewall panels 24,26 at their rear vertical edges include double turned edges and the backwall panel 28 includes a single turned edge. Thus, for an enclosure having only frontal access, the enclosure 10 includes at least three vertical wall panels; the edges which abut for fastening being formed such that at least one vertical wall panel includes a double turned edge at the edges which abut.

What is claimed and desired to be secured by Letters Patent of the U.S. is:

1. An enclosure for metal-enclosed switchgear having at least one access opening and being assembled from a plurality to generally planar panels, the enclosure comprising:
   at least three vertical wall panels, said vertical wall panels each including inwardly turned edges so as to define a first flange along at least a substantial portion of each vertical edge thereof, said three vertical wall panels when assembled defining three sides of said enclosure, a second inwardly turned edge being formed on at least one of said vertical wall panels so as to provide a second inwardly turned edge at each intersection where two of said vertical wall panels abut to define said three sides of said enclosure, said second inwardly turned edge forming a second flange extending from and being substantially perpendicular to said first flange; and
   means for assembling said enclosure, said assembling means affixing said first flange of a vertical wall panel to said second flange of another of said vertical wall panels, said first flange of a respective wall panel and said second flange of an abutting wall panel being substantially parallel and coextensive, each of said affixed flanges including an aperture, said assembling means comprising fasteners that are arranged internal to said enclosure, one of said fasteners being positioned through each of said apertures to directly clamp said affixed flanges.

2. The enclosure of claim 1 wherein a first of said vertical wall panels includes said second flange being formed along a substantial portion of each of the vertical edges thereof.

3. The enclosure of claim 1 further comprising a gasket member being provided between each of said affixed flanges.

4. An arrangement for assembling two or more enclosures comprising:
   a first enclosure including first and second sidewall panels and a first backwall panel, said first and second sidewall panels and said first backwall panel including inwardly turned edges to define flanges which are affixed together internal to said first enclosure;

a second enclosure including a second backwall panel and at least a third sidewall panel, said third sidewall panel and said second backwall panel including inwardly turned edges to define flanges which are affixed together internal to said second enclosure, said first and second backwall panels of said two enclosures being affixed to each other; and a seal member, each of said first and second enclosures further comprising a roof panel, said roof panel including double inwardly turned edges that are formed to provide roof flanges, said backwall panels including inwardly turned edges that are formed to provide flanges which are affixed to said roof flanges, said first sidewall panel of said first enclosure that is adjacent to said second enclosure being shorter in height than said second sidewall panel of said first enclosure and said third sidewall panel of said second enclosure so as to define an opening between said first and second enclosures adjacent said roof panels, said seal member being disposed about said roof flanges which abut along said first and second enclosures, said seal member comprising integrally formed receiving channels for receiving said roof flanges.

5. An enclosure for metal-enclosed switchgear having at least one access opening and being assembled from a plurality of generally planar panels, the enclosure comprising:

at least three vertical wall panels, said vertical wall panels each including inwardly turned edges so as to define a first flange along at least a substantial portion of each vertical edge thereof, said three vertical wall panels when assembled defining three sides of said enclosure, a second inwardly turned edge being formed on at least one of said vertical wall panels so as to provide a second inwardly turned edge at each intersection where two of said vertical wall panels abut to define said three sides of said enclosure, said second inwardly turned edge forming a second flange extending from and being substantially perpendicular to said first flange;

means for assembling said enclosure, said assembling means affixing said first flange of a vertical wall panel to said second flange of another of said vertical wall panels, said first flange of a respective vertical wall panel and said second flange of an abutting wall panel being substantially parallel and coextensive;

an access door; and means for pivotally mounting said access door, said access door mounting means being affixed to one of said first flanges of a vertical edge of one of said vertical wall panels which does not abut another of said vertical wall panels.

6. An enclosure for metal-enclosed switchgear having at least one access opening and being assembled from a plurality of generally planar panels, the enclosure comprising:

at least three vertical wall panels, said vertical wall panels each including inwardly turned edges so as to define a first flange along at least a substantial portion of each edge thereof, said three vertical wall panels when assembled defining three sides of said enclosure, a second inwardly turned edge being formed on at least one of said vertical wall panels so as to provide a second inwardly turned edge at each intersection where two of said vertical wall panels abut to define said three sides of said enclosure, said second inwardly turned edge forming a second flange extending from and being substantially perpendicular to said first flange;

means for assembling said enclosure, said assembling means affixing said first flange of a vertical wall panel to said second flange of another of said vertical wall panels, said first flange of a respective wall panel and said second flange of an abutting wall panel being substantially parallel and coextensive; and a roof panel, said roof panel including edges that are formed so as to provide respective third and fourth flanges, said third flange extending substantially perpendicularly to the plane of said roof panel and said fourth flange extending inwardly and substantially perpendicularly to said third flange, said roof panel being assembled to said three vertical wall panels by said assembling means by affixing said fourth flange of said roof panel to said first flanges along the upper horizontal edges of said vertical wall panels.

7. The enclosure of claim 6 further comprising a formed base, said base including a first upstanding member, said base further including a fifth flange along the top horizontal edge of said first upstanding member that extends substantially perpendicularly to said first upstanding member, said base further including a sixth flange along the bottom horizontal edge of said first upstanding member that extends substantially perpendicularly to said first upstanding member, said fifth flange being affixed by said assembly means to said first flanges along the lower horizontal edges of said vertical wall panels, when affixed to said enclosure, said fifth and sixth flanges extending inwardly to the enclosure.

8. The enclosure of claim 6 further comprising a formed base including a channel member having an upstanding member and two inwardly turned edges defining an upper, fifth flange and a lower, sixth flange, said formed base being assembled to said vertical wall panels by said assembly means by affixing said fifth flange to said first flange along the lower horizontal edge of said vertical wall panels.

9. The enclosure of claim 6 wherein at least one of said vertical wall panels is shorter in height than another of said vertical wall panels so as to define an opening of the enclosure.

10. The enclosure of claim 9 further comprising a cover for said opening, said cover being fabricated from a planar member and including first turned edges along at least two edges of said planar member for attachment to said roof and one or more of said vertical wall panels.

11. The enclosure of claim 10 wherein said planar member along at least one edge thereof includes a second turned edge that is formed to provide a cover flange that extends substantially perpendicularly to at least one of said first turned edges, the enclosure further comprising a channel member that is affixed to said cover flange and one of said vertical wall panels.

12. The enclosure of claim 6 further comprising a seal means being positioned during assembly between the abutting flanges of said vertical wall panels and between the abutting flanges of said roof panel and said vertical wall panels.

13. An enclosure for metal-enclosed switch-gear having at least one access opening and being assembled from a plurality of generally planar panels, the enclosure comprising:

at least three vertical wall panels, said vertical wall panels each including inwardly turned edges so as to define a first flange along at least a substantial portion of each vertical edge thereof, said three vertical wall panels when assembled defining three sides of said enclosure, a second inwardly turned edge being formed on at least one of said vertical wall panels so as to provide a second inwardly turned edge at each intersection where two of said vertical wall panels abut to define said three sides of said enclosure, said second inwardly turned edge forming a second flange extending from and being substantially perpendicular to said first flange, a first of said vertical wall panels including said second flange being formed along a substantial portion of each of the vertical edges thereof;

means for assembling said enclosure, said assembling means affixing said first flange of a vertical wall panel to said second flange of another of said vertical wall panels, said first flange of a respective wall panel and said second flange of an abutting wall panel being substantially parallel and coextensive; and at least one support member being affixed to said second flanges so as to horizontally span said first panel.

14. The enclosure of claim 13 wherein said first vertical wall panel further includes a third flange extending substantially perpendicularly to each of said second flanges, the second and third vertical wall panels along the vertical edges which do not abut another of said vertical wall panels further including said second flanges, the enclosure further comprising one or more side support members being affixed between said second flanges of said second and third vertical wall panels and said third flanges of said first vertical wall panel.

* * * * *

UNITED STATES PATENT AND TRADEMARK OFFICE
CERTIFICATE OF CORRECTION

PATENT NO. : 4,862,324

DATED : August 29, 1989

INVENTOR(S) : Arvydas J. Kalvaitis et al

It is certified that error appears in the above-identified patent and that said Letters Patent is hereby corrected as shown below:

Claim 1, line 3, change "to" to -- of --.

Signed and Sealed this

Twenty-fourth Day of July, 1990

*Attest:*

HARRY F. MANBECK, JR.

*Attesting Officer*  *Commissioner of Patents and Trademarks*